(12) United States Patent
Ketchen et al.

(10) Patent No.: US 8,188,752 B2
(45) Date of Patent: May 29, 2012

(54) YIELD IMPROVEMENT FOR JOSEPHSON JUNCTION TEST DEVICE FORMATION

(75) Inventors: Mark B. Ketchen, Hadley, MA (US); Shwetank Kumar, Yorktown Heights, NY (US); Matthias Steffen, Cortlandt Manor, NY (US); Christopher B. Lirakis, Portsmouth, RI (US); Richard Lazarus, Winchester, MA (US)

(73) Assignees: International Business Machines Corporation, Armonk, NY (US); Raytheon BBN Technologies Corp., Cambridge, MA (US)

( * ) Notice: Subject to any disclaimer, the term of this patent is extended or adjusted under 35 U.S.C. 154(b) by 428 days.

(21) Appl. No.: 12/502,640

(22) Filed: Jul. 14, 2009

(65) Prior Publication Data

US 2011/0012619 A1 Jan. 20, 2011

(51) Int. Cl.
*G01R 31/02* (2006.01)

(52) U.S. Cl. .......................................... 324/637; 324/652
(58) Field of Classification Search .................. 324/637, 324/652
See application file for complete search history.

(56) References Cited

U.S. PATENT DOCUMENTS

| | | | |
|---|---|---|---|
| 5,123,733 A | 6/1992 | Divin | |
| 6,366,096 B1 | 4/2002 | Talanov et al. | |
| 6,897,468 B2 * | 5/2005 | Blais et al. | 257/9 |
| 7,002,174 B2 | 2/2006 | Il'ichev et al. | |
| 7,418,283 B2 | 8/2008 | Amin | |
| 2007/0152747 A1 * | 7/2007 | Smith et al. | 330/10 |
| 2008/0086438 A1 | 4/2008 | Amin et al. | |
| 2009/0289638 A1 * | 11/2009 | Farinelli et al. | 324/652 |

* cited by examiner

*Primary Examiner* — Vincent Q Nguyen
(74) *Attorney, Agent, or Firm* — Cantor Colburn LLP; Vazken Alexanian

(57) ABSTRACT

An apparatus for measuring component performance including a feed line having an input port and an output port, a first resonator connected to the feed line, a first Josephson junction device connected to the first resonator and to ground, and a second resonator connected to the feed line and to ground.

20 Claims, 3 Drawing Sheets

YIELD IMPROVEMENT FOR JOSEPHSON JUNCTION TEST DEVICE FORMATION

FIELD OF INVENTION

The present invention relates to Josephson junction devices and superconducting resonators, and more specifically, to testing Josephson junction devices.

DESCRIPTION OF RELEVANT ART

Josephson junction devices are superconducting devices that may be used in quantum information systems. The development of superconducting quantum information systems often includes the testing of numerous Josephson junction devices and devices made from Josephson junction devices to gather performance data. The Josephson junction devices operate at cryogenic temperatures that are time consuming to achieve. A system and method that allows multiple Josephson junction devices and devices made from Josephson junction devices to be tested efficiently in a testing cycle is desired.

BRIEF SUMMARY

In one aspect of the present invention, an apparatus for measuring component performance includes a feed line having an input port and an output port, a first resonator connected to the feed line, and a first Josephson junction device connected to the first resonator and to ground.

In another aspect of the present invention, a method for measuring the performance of a circuit component includes applying a microwave signal to an input port of a circuit, wherein the input port is connected to a feed line, a first resonator is connected to the feed line and a first Josephson junction device is connected to the first resonator and ground, and measuring the frequency response of the circuit at an output port connected to the feed line.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
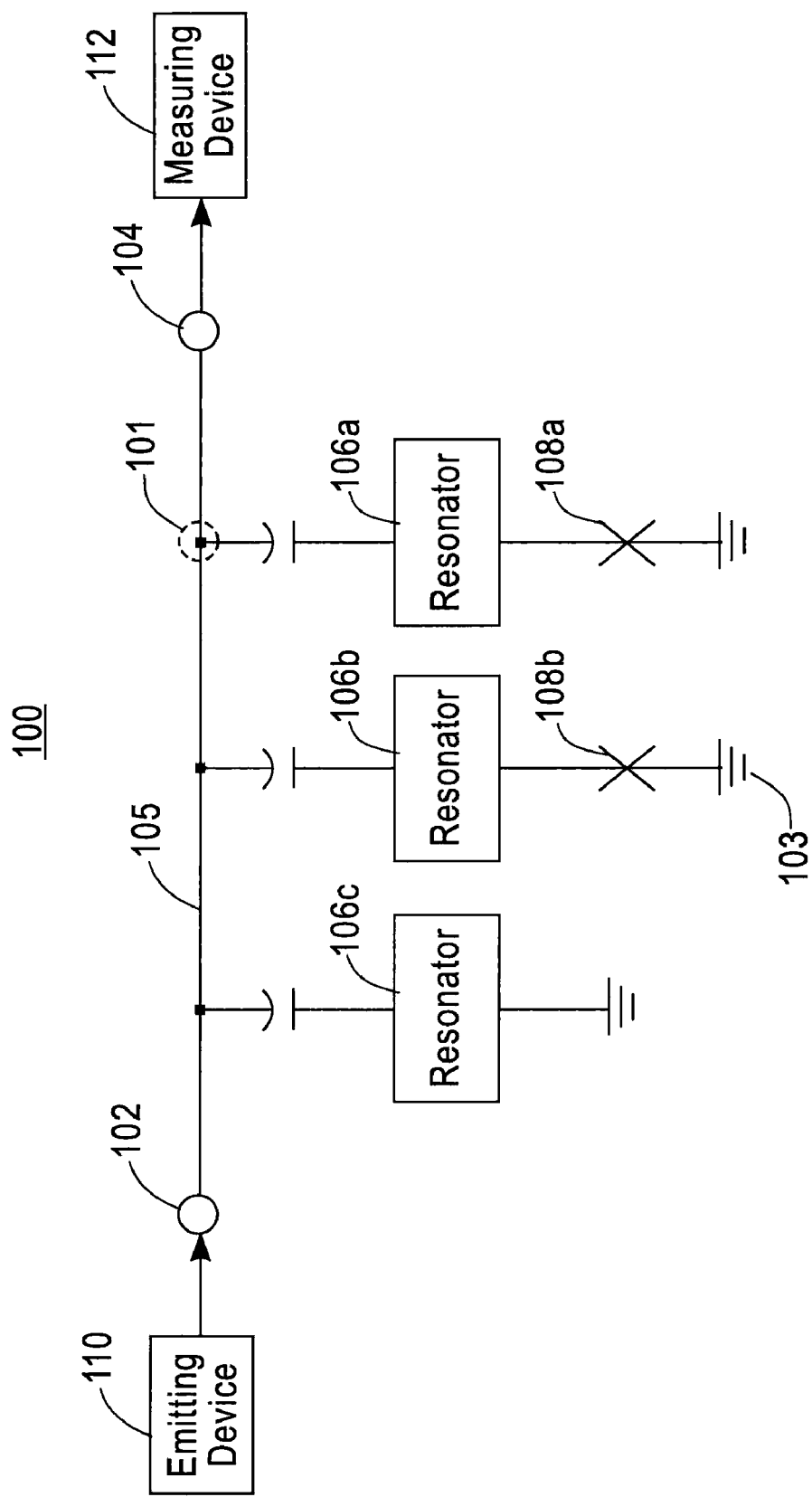
FIG. 1 is a block diagram illustrating an exemplary embodiment of a circuit in a system.

FIG. 1 illustrates an exemplary embodiment of a system for evaluating Josephson junction devices. The system includes a circuit 100. The circuit 100 includes a feed line 105, an input port 102, and an output port 104. The input port 102 is connected to a microwave emitting device 110, such as, for example, a microwave frequency synthesizer or a network analyzer that is capable of emitting a range of microwave frequencies that excite the circuit 100. The output port 104 is connected to a microwave measuring device 112 that may include, for example, a network analyzer or a homodyne detection circuit that operates to measure the response of the circuit. A first resonator 106a is capacitively coupled to the feed line 105 at a first node 101. The first resonator 106a is also connected to a first Josephson junction device 108a that is, in turn, connected to the second node 103 (ground). The illustrated embodiment further shows a second resonator 106b and Josephson junction device 108b pair, however any number of resonator and Josephson junction device pairs may be similarly connected. A third resonator 106c may be connected to the first node 101 and the second node 103 in parallel to the resonator and Josephson junction device pairs (106a/108a, 106b/108b). The third resonator 106c may be used for calibrating the measurements from the circuit 100. The resonators are designed with different lengths such that their resonant frequencies are different. The different lengths allow for frequency division multiplexed operation. The capacitive coupling quality factor Q of the resonators 106 should be greater than the quality factor Q induced by the internal losses of the Josephson junction devices 108. This allows the losses in the Josephson junction devices 108 to be more accurately measured.

Figure 2:
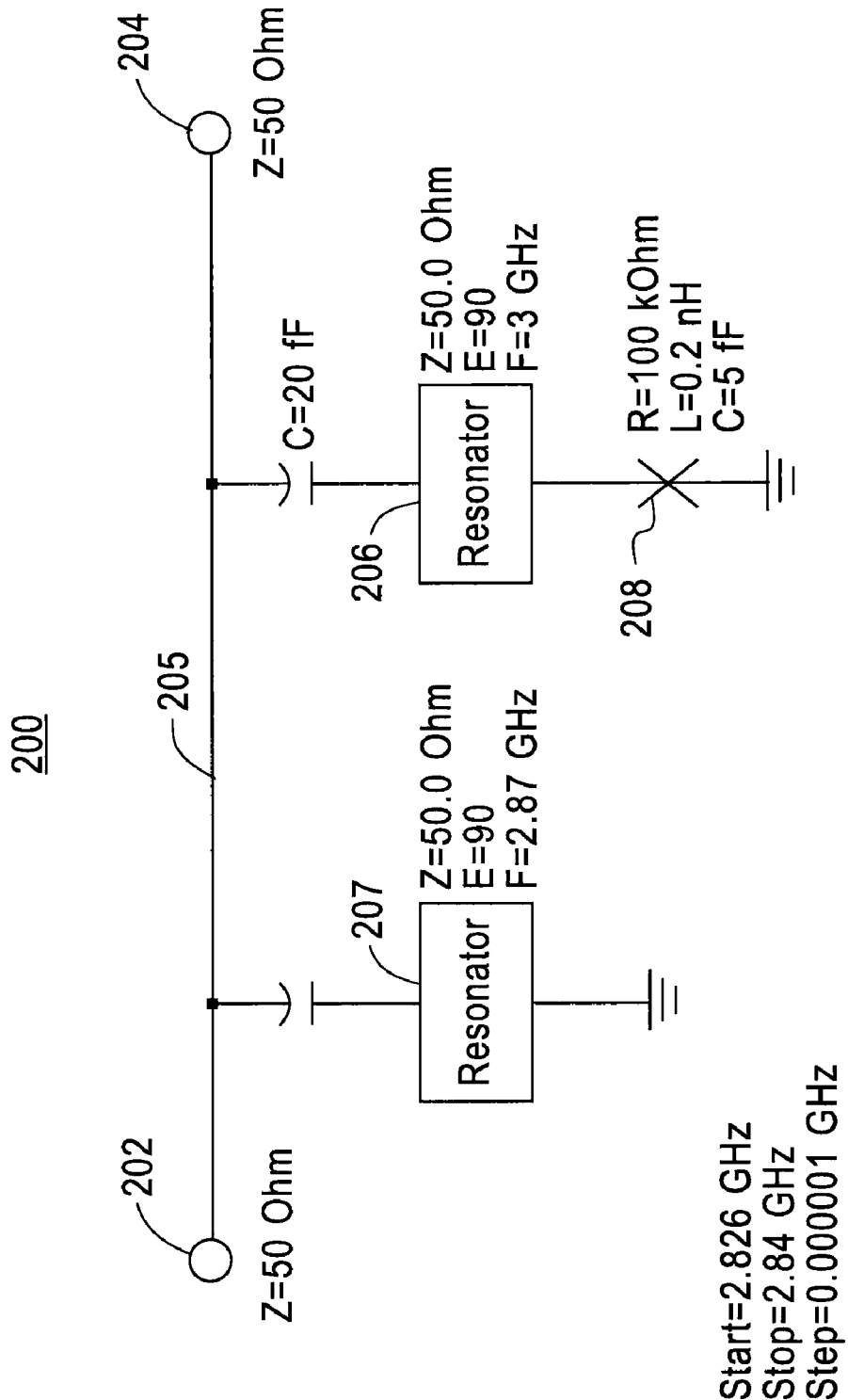
FIG. 2 is a block diagram illustrating another example of a circuit in the system.

FIG. 2 illustrates a circuit 200 that is similar to the circuit 100 described above. The circuit 200 includes example values of the components in the system used for testing purposes. The method described below may be used to evaluate the performance of individual Josephson junction devices in a similar circuit that includes any number of Josephson junction devices using a common input and output port in a single testing cycle. The operation of the circuit will be described referencing FIG. 2. In this regard, the response of the Josephson junction device may be measured as a function of the readout frequency, f, by exciting the first port 202 with a microwave signal and detecting the signal at the second port 204 with the measurement device. The measurement device measures a forward scattering parameter S21 of the two port circuit. For excitation frequencies far from the resonance frequency of the resonators, |S21|=1 (0 dB). When the excitation frequency is close to the resonance frequencies of the resonators (f=fri, i=1,2) the resonators will load the feed line resulting in a transmission null and |S21| goes to) for a high quality factor resonator. For f~fri the response may be shown as:

$$S21(\delta x) = 1 - \left(\frac{Qy}{Qc} \frac{1}{1 + 2jQy\delta x}\right)$$

where Qr and Qc are the total and coupling quality factors of the resonator, respectively and $\delta x = (fri-f)/fri$. A number of dissipation mechanisms contribute to the measured quality factor Qr according to the equation:

$$Qy^{-1} = Qc^{-1} + Qsub^{-1} + Qsup^{-1} + QJJ^{-1} + \ldots$$

where Qc is the loss due to the coupling capacitor and is set lithographically by the design of the coupling capacitor, Qsub is due to the substrate loss and may be limited to approximately 1 million by lowering the operating temperature to a level that limits the quality factor due to junction loss. The quality factor of each resonator may be determined by fitting the resonator response (S21 vs. f) to the expression (in the first equation above). The junction loss may be determined by calculating the difference in inverse quality factors (in the second equation above) of the calibrating resonator 207 and the resonator 206 in series with the Josephson junction 208.

The resonator quality factor is power dependent and is calibrated using a test/dummy resonator 207. Thus, characterizing the device junction loss at a few photon number power levels may also account for the loss in the resonator.

Figure 3:
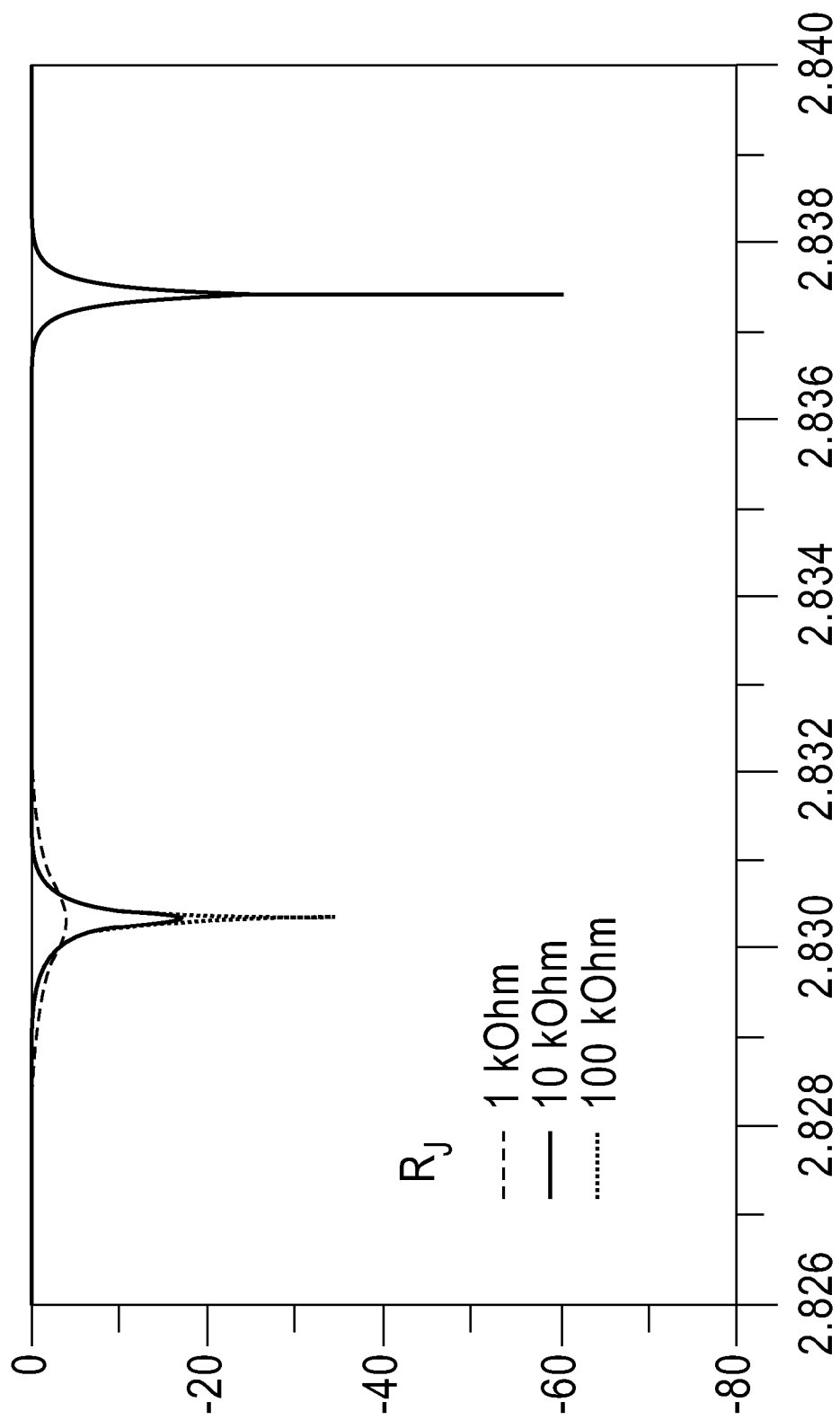
FIG. 3 is a graphical representation of testing results of the circuit of FIG. 2.

FIG. 3 illustrates example simulated test results of the circuit in FIG. 2 that have been output to a display. FIG. 3 shows two resonance frequencies for the circuit fr1=2.8305 GHz for the resonator 206 paired to the Josephson junction device 208 and fr2=2.8375 GHz for the calibration resonator 207. As the shunting resistance that represents the loss in the Josephson junction device is changed from 1 K$\Omega$ to 100 K$\Omega$, the transmission null deepens indicating a junction with comparatively less loss. At resonance S21=1−Qr/Qc. For a constant Qc defined lithographically, S21 decreases as QJJ moves towards 0. Thus, FIG. 3 shows that S21 at the resonance frequency is closely related to the junction loss when the Josephson junction device is operating properly, and the junction loss may be measured using the parameter.

Other embodiments may include measurements of other parameters such as, for example, a reflection parameter S11. The line shape may be fitted in a similar manner as described above for the S21 parameter. The Q factor is indicative of losses in the Josephson Junction.

Other Josephson junction device parameters such as, for example, critical current are dependent on other features of the S21 characteristics such as fr2, and may also be measured using a similar system and method. Alternatively, increasing the microwave readout power of the resonator and measuring the power at which the junction switching occurs is a method for measuring the junction Ic.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The figures depicted herein are just one example. There may be many variations to the figures or the steps (or operations) described therein without departing from the spirit of the invention. For instance, the steps may be performed in a differing order or steps may be added, deleted or modified. All of these variations are considered a part of the claimed invention.

Although specific aspects may be associated with specific example embodiments of the present invention, as described herein, it will be understood that the aspects of the example embodiments, as described herein, may be combined in any suitable manner.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An apparatus for measuring component performance:
    a feed line having an input port and an output port;
    a first resonator connected to the feed line;
    a first Josephson junction device connected in series with the first resonator and ground; and
    a second resonator connected to the feed line and to ground.

2. The apparatus of claim 1, wherein apparatus further comprises a first device operative to emit a microwave signal, the first device connected to the input port.

3. The apparatus of claim 2, wherein the first device is operative to emit the microwave signal over a range of frequencies.

4. The apparatus of claim 1, wherein apparatus further comprises a second device operative to measure a microwave signal, the second device connected to the output port.

5. The apparatus of claim 1, wherein the first resonator is a transmission line resonator.

6. The apparatus of claim 1, wherein the second resonator is capacitively connected to the feed line.

7. The apparatus of claim 1, wherein the apparatus further comprises:
    a third resonator connected to the feed line; and
    a second Josephson junction device connected to the third resonator and to ground.

8. The apparatus of claim 1, wherein the feed line is a microwave feed line.

9. A method for measuring the performance of a circuit component comprising:
    applying a microwave signal to an input port of a circuit, wherein the input port is connected to a feedline, a first resonator is connected to the feed line and a first Josephson junction device is connected in series with the first resonator and ground and a second resonator is connected to the feedline and ground; and
    measuring the frequency response of the circuit at an output port connected to the feed line.

10. The method of claim 9, wherein the method further comprises varying the frequency of the applied microwave signal over a range of frequencies.

11. The method of claim 10, wherein the method further comprises identifying measured transmission nulls in the response of the circuit.

12. The method of claim 10, wherein a loss in Josephson junction device is determined by calculating difference in inverse quality factors of a calibrating resonator and the first resonator.

13. The method of claim 10, wherein the method further comprises calculating the critical current of the Josephson junction device responsive to measuring the frequency response of the circuit at the output port.

14. The method of claim 10, wherein the method further comprises calculating a forward scattering parameter ($S_{21}$) at resonance of the circuit, wherein $S_{21}$=1−Qr/Qc where Qr is the total quality factor of the first resonator and Qc is the coupling quality factor of the first resonator.

15. The method of claim 10, wherein the loss in current at the Josephson junction device is used to evaluate the performance of the Josephson junction device.

16. The method of claim 15, wherein the forward scattering parameter is used to determine losses of each Josephson junction device in the circuit.

17. The method of claim 10, wherein the method further comprises calculating a reverse scattering parameter ($S_{11}$) at resonance of the circuit.

18. The method of claim 10, wherein the frequency response of the circuit is used to determine losses of each Josephson junction device in the circuit.

19. The method of claim 10, wherein the method further comprises extracting the resistance parameter of the Josephson junction and performing a statistical analysis to calculate a loss at the Josephson junction.

20. The method of claim 10, wherein the method further comprises extracting the critical current parameter of the Josephson junction and performing a statistical analysis to calculate a yield of the Josephson junction.

* * * * *